(12) United States Patent  
Xu

(10) Patent No.: US 9,323,123 B2
(45) Date of Patent: Apr. 26, 2016

(54) STRUCTURE OF PIXEL

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 72 days.

(21) Appl. No.: 14/356,208

(22) PCT Filed: Jan. 21, 2014

(86) PCT No.: PCT/CN2014/070971
§ 371 (c)(1),
(2) Date: May 5, 2014

(87) PCT Pub. No.: WO2015/096248
PCT Pub. Date: Jul. 2, 2015

(65) Prior Publication Data
US 2015/0309380 A1  Oct. 29, 2015

(30) Foreign Application Priority Data
Dec. 27, 2013  (CN) .......................... 2013 1 0733619

(51) Int. Cl.
H01L 29/08 (2006.01)
G02F 1/1362 (2006.01)
G02F 1/1368 (2006.01)
H01L 27/12 (2006.01)
G09G 3/36 (2006.01)

(52) U.S. Cl.
CPC ........ *G02F 1/136286* (2013.01); *G02F 1/1362* (2013.01); *G02F 1/1368* (2013.01);

(Continued)

(58) Field of Classification Search
CPC .................. H01L 27/14603; H01L 27/14605; H01L 27/14609; H01L 27/14812; H01L 27/3248; H01L 2021/775; H01L 27/1214; H01L 27/124; H01L 27/3232; H01L 51/0076; H01L 27/32–27/326; H01L 51/50–51/5287; H01L 2227/32–2227/326; H01L 2251/5323–2251/5361; H01L 2924/12044
USPC .................. 257/79–103, 40, 59, 72, E51.001, 257/E51.01
See application file for complete search history.

(56) References Cited

U.S. PATENT DOCUMENTS

2002/0047818 A1  4/2002  Yamamoto et al.
2009/0078972 A1*  3/2009  Hwang ............. H01L 27/14601
                                                          257/290

(Continued)

FOREIGN PATENT DOCUMENTS

CN  101271904 A  9/2008
CN  101369408 A  2/2009

(Continued)

*Primary Examiner* — Steven Loke
*Assistant Examiner* — Samuel Park
(74) *Attorney, Agent, or Firm* — Andrew C. Cheng

(57) ABSTRACT

The present invention provides a structure of a pixel, which has a simple structure and employs an arrangement where a terminal of the storage capacitor $C_{st}$ is of the same potential as the gate line. In other words, under a condition of not reducing aperture ratio, an arrangement of two (or three) gate lines is used, of which one is used to early set the voltage of the pixel electrode to a reference voltage by one period of line scanning time and, also, which is set to partly overlap the pixel electrode of a structure of another pixel to provide a storage capacitor, so as to shorten the charging time of the pixel unit and increase the charging speed of the pixel unit.

8 Claims, 3 Drawing Sheets

(52) U.S. Cl.
CPC ...... *G02F1/13624* (2013.01); *G02F 1/136213* (2013.01); *G09G 3/3655* (2013.01); *H01L 27/124* (2013.01); *H01L 27/1255* (2013.01); *G02F 2001/13629* (2013.01); *G09G 3/36* (2013.01)

(56) References Cited

U.S. PATENT DOCUMENTS

2011/0069048 A1\* 3/2011 Cao ....................... G02F 1/1309 345/204

2014/0192301 A1\* 7/2014 Wu ......................... G02B 5/22 349/106

FOREIGN PATENT DOCUMENTS

| CN | 101452165 A | 6/2009 |
| CN | 102023424 A | 4/2011 |
| CN | 102033372 A | 4/2011 |
| CN | 103018988 A | 4/2013 |

\* cited by examiner

STRUCTURE OF PIXEL

BACKGROUND OF THE INVENTION

1. Field of the Invention

The present invention relates to the field of liquid crystal displaying, and in particular to a structure of a pixel that increases a charging speed of a pixel unit.

2. The Related Arts

A thin-film transistor liquid crystal display (TFT LCD) is a display device that has various advantages, including thin device body, saving power, and being free of radiation, and is thus widely used. Most of the liquid crystal displays that are currently available in the market are backlighting liquid crystal displays, which comprise a liquid crystal panel and a backlight module. The liquid crystal panel comprises two glass substrates that are opposite to and parallel with each other and liquid crystal molecules arranged between the two substrates and the operation principle is that a driving voltage is applied to the two glass substrates to control rotation directions of the liquid crystal molecules in order to refract out light emitting from the backlight module for generating images.

Liquid crystal molecules are anisotropic in refractive index. Through application of a driving voltage to the liquid crystal molecules to re-define an anisotropic axis of refractive index, the brightness of the light transmitting through the liquid crystal molecules can be controlled. Since thee are impurity molecules contained in the liquid crystal molecules, polarization may result after long term application of DC voltage driving. Consequently, AC voltage driving is often adopted for liquid crystal displaying. The largest driving voltage that is needed for AC voltage driving is twice of the liquid crystal driving voltage so that an extended period time is needed for charging of a pixel unit.

The formula for the time period necessary for charging a pixel unit is $t=RC*\ln[(V_1-V_0)/(V_1-V_t)]$, wherein R stands for the sum of the resistance of a data line and the source/drain contact resistance, C is the sum of coupling capacitance of wiring, $V_1$ is the voltage value that a storage capacitor $C_{st}$ can be finally charged or discharged (approximately $2*V_{com}$, where $V_{com}$ is reference voltage), $V_t$ is the voltage value of the storage capacitor $C_{st}$ (which is greater than 0 and less than $2*V_{com}$), and V0 is the initial voltage value of the storage capacitor $C_{st}$.

A conventional pixel unit needs to have the storage capacitor $C_{st}$ charged so as to have the voltage raised from $V_0$ to $V_t$ within the scanning time of one line. For liquid crystal panels having low resolutions and low refresh rates, the voltage of the storage capacitor $C_{st}$ can reach a predetermined gray level voltage within the scanning time of one line. However, for a present-day liquid crystal panel having a high resolution and a high refresh rate, it is generally difficult to have a pixel unit charged to a predetermined grey level voltage within the scanning time of one line. Further, with the progress of the liquid crystal displaying technology and people's demand for high quality visual enjoyment, high resolution and refresh of image with high frame speed are now the direction of development of the liquid crystal panels. However, the charging time that a pixel unit needs for high resolution and high frame speed displaying has reached the limit thereof.

SUMMARY OF THE INVENTION

An object of the present invention is to provide a structure of a pixel, in which, under a condition of not reducing aperture ratio, an arrangement of two (or three) gate lines is adopted to allow for early setting a voltage of a pixel unit to a reference voltage by one period of line scanning time so as to shorten the charging time of the pixel unit and increase the charging speed of the pixel unit.

To achieve the object, the present invention provides a pixel structure, which comprises:

a substrate;

a data line, a first gate line, a second gate line, and a common electrode line, wherein the data line, the first gate line, the second gate line, and the common electrode line are arranged on the substrate and the common electrode line is located between the first gate line and the second gate line; and a pixel unit, wherein the pixel unit comprises: a first thin-film transistor, a second thin-film transistor, and a pixel electrode, the first thin-film transistor being electrically connected to the data line, the second gate line, and the pixel electrode, the second thin-film transistor being electrically connected to the common electrode line, the first gate line, and the pixel electrode;

the first gate line controlling the second thin-film transistor so as to control the pixel electrode to early discharge to the common electrode line by one period of line scanning time.

The pixel electrode of the pixel unit partly overlaps a first gate line of a structure of a pixel located exactly under the pixel unit to form a storage capacitor of the pixel unit.

The structure of the pixel further comprises a third gate line that is arranged on the substrate in such a way that the third gate line is located on the same side as the first gate line, the second gate line, and the common electrode line and partly overlaps the pixel electrode to form a storage capacitor of the pixel unit. The third gate line has the same signal as that of the first gate line.

The second gate line provides a scan signal to the pixel unit so that the first thin-film transistor responds to the scan signal to have a data signal of the data line stored to the storage capacitor.

The first thin-film transistor comprises a first gate terminal, a first source terminal, and a first drain terminal. The first gate terminal is connected to the second gate line. The first source terminal is connected to the data line. The first drain terminal is connected through a via to the pixel electrode.

The common electrode line provides a reference voltage to the pixel unit and the first gate line supplies a control signal to have the second thin-film transistor of the pixel unit early switched on by one period of line scanning time so as to early set a voltage of the pixel electrode to the reference voltage by one period of line scanning time.

The second thin-film transistor comprises a second gate terminal, a second source terminal, and a second drain terminal. The second gate terminal is connected to the first gate line. The second source terminal is connected to the common electrode line. The second drain terminal is connected to the pixel electrode.

The second source terminal is connected through a via to the common electrode line and the second drain terminal is connected through a via to the pixel electrode.

The pixel electrode comprises a transparent conductive layer and the pixel electrode is formed by depositing indium tin oxide.

The structure of the pixel is applicable to a liquid crystal display panel that is a TN type liquid crystal display panel or a PVA type liquid crystal display panel.

The present invention also provides a structure of a pixel, which comprises:

a substrate;

a data line, a first gate line, a second gate line, and a common electrode line, wherein the data line, the first gate line, the second gate line, and the common electrode line are arranged on the substrate and the common electrode line is located between the first gate line and the second gate line; and a pixel unit, wherein the pixel unit comprises: a first thin-film transistor, a second thin-film transistor, and a pixel electrode, the first thin-film transistor being electrically connected to the data line, the second gate line, and the pixel electrode, the second thin-film transistor being electrically connected to the common electrode line, the first gate line, and the pixel electrode;

the first gate line controlling the second thin-film transistor so as to control the pixel electrode to early discharge to the common electrode line by one period of line scanning time;

wherein the pixel electrode of the pixel unit partly overlaps a first gate line of a structure of a pixel located exactly under the pixel unit to form a storage capacitor of the pixel unit;

further comprising a third gate line that is arranged on the substrate in such a way that the third gate line is located on the same side as the first gate line, the second gate line, and the common electrode line and partly overlaps the pixel electrode to form a storage capacitor of the pixel unit, the third gate line having the same signal as that of the first gate line;

wherein the second gate line provides a scan signal to the pixel unit so that the first thin-film transistor responds to the scan signal to have a data signal of the data line stored to the storage capacitor;

wherein the first thin-film transistor comprises a first gate terminal, a first source terminal, and a first drain terminal, the first gate terminal being connected to the second gate line, the first source terminal being connected to the data line, the first drain terminal being connected through a via to the pixel electrode; and wherein the common electrode line provides a reference voltage to the pixel unit and the first gate line supplies a control signal to have the second thin-film transistor of the pixel unit early switched on by one period of line scanning time so as to early set a voltage of the pixel electrode to the reference voltage by one period of line scanning time.

The second thin-film transistor comprises a second gate terminal, a second source terminal, and a second drain terminal. The second gate terminal is connected to the first gate line. The second source terminal is connected to the common electrode line. The second drain terminal is connected to the pixel electrode.

The second source terminal is connected through a via to the common electrode line and the second drain terminal is connected through a via to the pixel electrode.

The pixel electrode comprises a transparent conductive layer and the pixel electrode is formed by depositing indium tin oxide.

The structure of the pixel is applicable to a liquid crystal display panel that is a TN type liquid crystal display panel or a PVA type liquid crystal display panel.

The efficacy of the present invention is that the present invention provides a structure of a pixel, which has a simple structure and employs an arrangement where a terminal of the storage capacitor $C_{st}$ is of the same potential as the gate line. In other words, under a condition of not reducing aperture ratio, an arrangement of two (or three) gate lines is used, of which one is used to early set the voltage of the pixel electrode to a reference voltage by one period of line scanning time and, also, which is set to partly overlap the pixel electrode of a structure of another pixel to provide a storage capacitor, so as to shorten the charging time of the pixel unit and increase the charging speed of the pixel unit.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
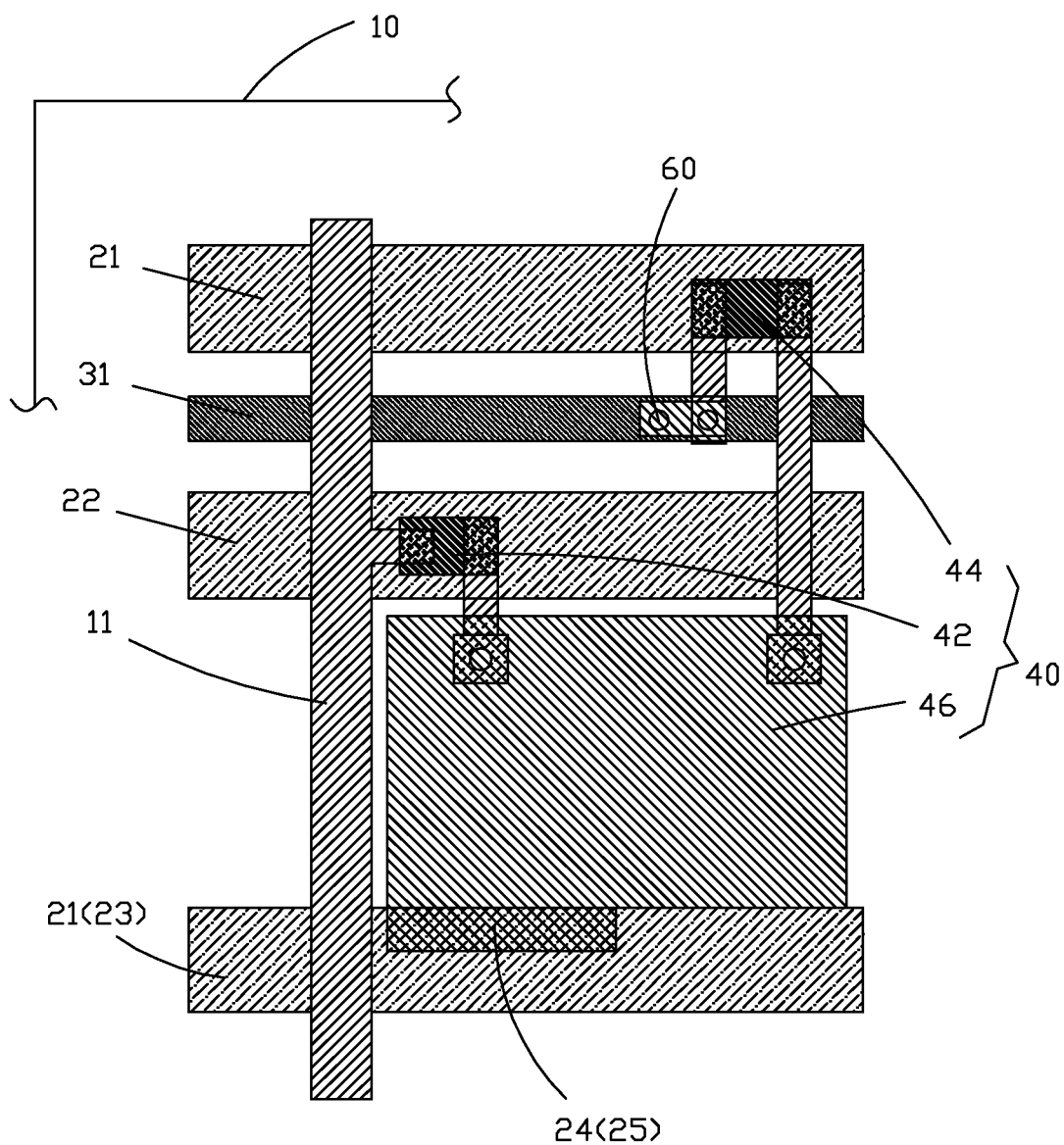
FIG. 1 is a schematic view showing a structure of a pixel according to the present invention.
Figure 2:
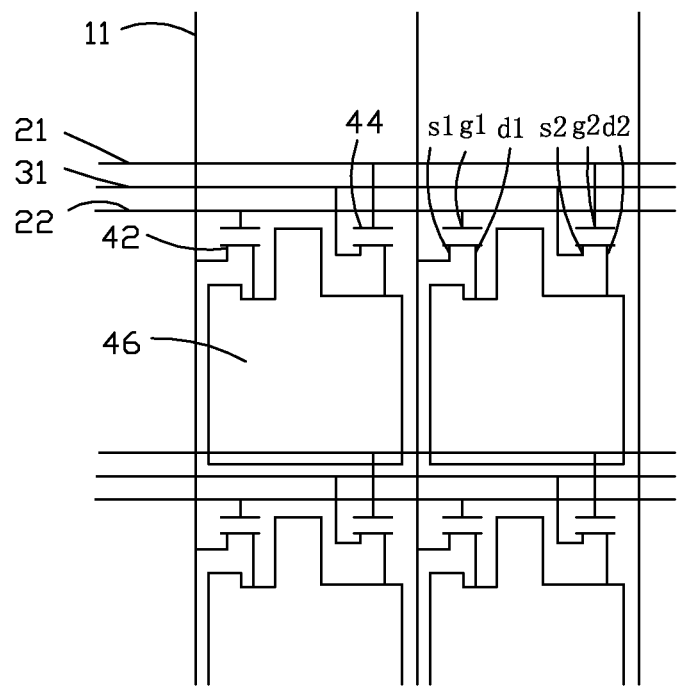
FIG. 2 is a diagram of a driving circuit of an array substrate that employs the structure of the pixel according to the present invention.

Referring to FIGS. 1 and 2, the present invention provides a structure of a pixel, which comprises: a substrate 10, a data line 11, a first gate line 21, a second gate line 22, a common electrode line 31, and a pixel unit 40. The data line 11, the first gate line 21, the second gate line 22, and the common electrode line 31 are arranged on the substrate 10. The common electrode line 31 is arranged between the first gate line 21 and the second gate line 22. Preferably, the first gate line 21, the second gate line 22, the common electrode line 31 are all arranged perpendicular to the data line 11. The pixel unit 40 comprises: a first thin-film transistor 42, a second thin-film transistor 44, and a pixel electrode 46. The first thin-film transistor 42 is electrically connected to the data line 11, the second gate line 22, and the pixel electrode 46. The second thin-film transistor 44 is electrically connected to the common electrode line 31, the first gate line 21, and the pixel electrode 46. The pixel electrode 46 of the pixel unit 40 is arranged to overlap a portion 24 of a first gate line 21 of a structure of another pixel that is located exactly under the pixel unit 40 in order to form a storage capacitor $C_{st}$ of the pixel unit 40. The first gate line 21 controls an operation condition of the second thin-film transistor 44 in order to achieve controlling the pixel electrode 46 to early discharge to the common electrode line 31 by one period of line scanning time to thereby shorten a charging time of the pixel unit 40 and increase a charging speed of the pixel unit.

For a structure of a pixel that is a pixel structure of a bottommost line of a panel, the pixel unit 40, the second gate line 22, the common electrode line 31, and the data line 11 of the structure of the pixel can be removed with only the first gate line 21 preserved to allow the first gate line 21 to provide a storage capacitor $C_{st}$ for a structure of a pixel located above it. Alternatively, the pixel structure of the pixel unit 40, the second gate line 22, the common electrode line 31, and the data line 11 may be kept but only the first gate line 21 is employed to achieve the same purpose. As an alternative arrangement not limited to what described above, if a structure of a pixel is a pixel structure of a bottommost line of a panel, a third gate line 23 may additionally provided and arranged on the substrate 10 in such a way that the third gate line 23 is located on the same side of the first gate line 21, the second gate line 22, and the common electrode line 31 and overlaps a portion 25 of the pixel electrode 46 to form a storage capacitor $C_{st}$ for the pixel unit 40. Preferably, the third gate line 23 carries the same signal as that of the first gate line 21.

The present invention provides a structure of a pixel, which adopts a $C_{st}$ on gate (a terminal of the storage capacitor $C_{st}$ being of the same potential with the gate line), in which the storage capacitor $C_{st}$ that is formed by the gate line 21 (23) overlapping a portion 24 (25) of the pixel electrode 46 is set on the gate line 21 (23) to achieve a purpose of not reducing the aperture ratio of the pixel. The pixel electrode 46 comprises a transparent conductive layer and the pixel electrode 46 is formed by depositing indium tin oxide.

Specifically, the second gate line 22 functions to provide a scan signal to the pixel unit 40 so that the first thin-film transistor 42 responds to the scan signal to store a data signal carried by the data line 11 to the storage capacitor $C_{st}$. The common electrode line 31 functions to provide a reference voltage to the pixel unit 40. The first gate line 21 provides a control signal to make the second thin-film transistor 44 of the pixel unit 40 switched on early by one period of line scanning time thereby early setting the voltage of the pixel electrode 46 to the reference voltage by one period of line scanning time.

The first thin-film transistor 42 comprises a first gate terminal g1, a first source terminal s1, and a first drain terminal d1. The first gate terminal g1 is connected to the second gate line 22; the first source terminal s1 is connected to the data line 11; and the first drain terminal d1 is connected to the pixel electrode 46. Further, the first drain terminal d1 is connected to the pixel electrode 46 through a via 60. The second thin-film transistor 44 comprises a second gate terminal g2, a second source terminal s2, and a second drain terminal d2. The second gate terminal g2 is connected to the first gate line 21; the second source terminal s2 is connected to the common electrode line 31; and the second drain terminal d2 is connected to the pixel electrode 46. The second source terminal s2 is connected via a transparent conductive layer to the common electrode line 31 and the transparent conductive layer has an end connected through a via 60 to the second source terminal s2 and an opposite end connected through a via 60 to the common electrode line 31, whereby the second source terminal s2 and the common electrode line 31 are connected to each other through the vias 60. The second drain terminal d2 is connected through a via 60 to the pixel electrode 46.

A practical operation process is as follows:

Firstly, a control signal carried by the first gate line 21 is set to a high voltage level to control the second thin-film transistor 44 to switch on, whereby the second thin-film transistor 44 uses the common electrode line 31 to set the voltage of the pixel electrode 46 of the pixel unit 40 to a reference voltage. After one period of line scanning time, the control signal of the first gate line 21 is set to a low voltage level, while at the same time, a scan signal carried by the second gate line 22 is set to a high voltage level so that the first thin-film transistor 42 is switched on and a data signal carried on the data line 11 is stored to the storage capacitor $C_{st}$ that is made up of the pixel electrode 46 of the pixel unit 40 and a first gate line 21 of another structure of a pixel that is located exactly under the pixel unit 40 (and if the pixel unit 40 is a pixel unit 40 of a structure of a pixel of a bottommost line of a panel, the data signal of the data line 11 can alternatively be stored to the storage capacitor $C_{st}$ that is made up of the pixel electrode 46 of the pixel unit 40 and a third gate line 23), in order to maintain the operation condition of the pixel within the time period of the frame. When the scan signal of the second gate line 22 goes to a low voltage level, the first thin-film transistor 42 is shut off and charging to the pixel unit 40 is completed. Since during the time of charging the pixel unit 40, the voltage of the pixel electrode 46 has been early set to the reference voltage by one period of line scanning time, the charging time of the pixel unit 40 is shortened and thus, the charging speed of the pixel unit is increased.

Figure 3:
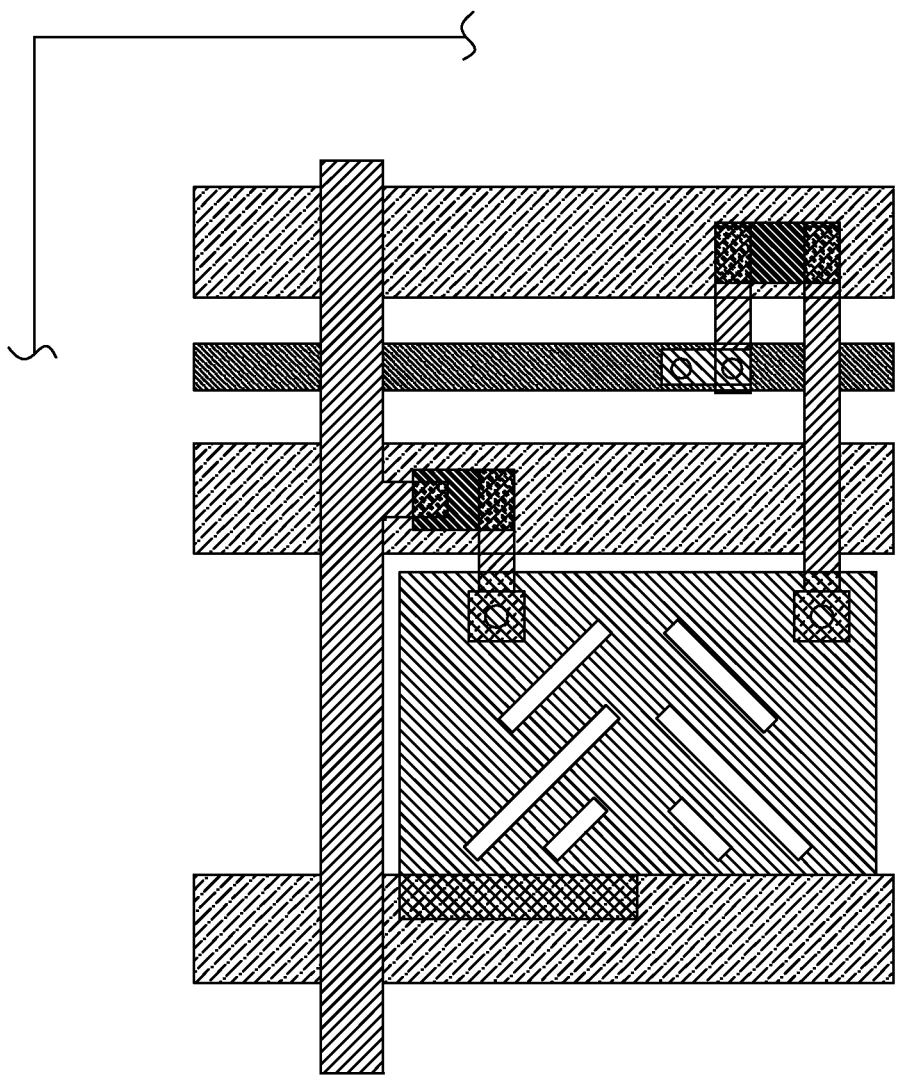
FIG. 3 is a schematic view showing a structure of a pixel according to another embodiment of the present invention.

The structure of a pixel provided by the present invention is applicable to a TN (Twisted Nematic) liquid crystal panel (as shown in FIG. 1) or a PVA (Patterned Vertical Alignment) liquid crystal panel (as shown in FIG. 3), but not limited to the TN and PVA panels.

In summary, the present invention provides a structure of a pixel, which has a simple structure and employs an arrangement where a terminal of the storage capacitor $C_{st}$ is of the same potential as the gate line. In other words, under a condition of not reducing aperture ratio, an arrangement of two (or three) gate lines is used, of which one is used to early set the voltage of the pixel electrode to a reference voltage by one period of line scanning time and, also, which is set to partly overlap the pixel electrode of a structure of another pixel to provide a storage capacitor, so as to shorten the charging time of the pixel unit and increase the charging speed of the pixel unit.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A structure of a pixel, comprising:
    a substrate;
    a data line, a first gate line, a second gate line, and a common electrode line, wherein the data line, the first gate line, the second gate line, and the common electrode line are arranged on the substrate and the common electrode line is located between the first gate line and the second gate line; and
    a pixel unit, wherein the pixel unit comprises: a first thin-film transistor, a second thin-film transistor, and a pixel electrode, the first thin-film transistor being electrically connected to the data line, the second gate line, and the pixel electrode, the second thin-film transistor being electrically connected to the common electrode line, the first gate line, and the pixel electrode;
    the first gate line controlling the second thin-film transistor so as to control the pixel electrode to early discharge to the common electrode line by one period of line scanning time
    wherein the pixel electrode of the pixel unit partly overlaps a first gate line of a structure of an adjacent pixel located adjacent and under the pixel unit to form a storage capacitor of the pixel unit.

2. The structure of the pixel as claimed in claim 1, wherein the second gate line provides a scan signal to the pixel unit so that the first thin-film transistor responds to the scan signal to have a data signal of the data line stored to the storage capacitor.

3. The structure of the pixel as claimed in claim 2, wherein the first thin-film transistor comprises a first gate terminal, a first source terminal, and a first drain terminal, the first gate terminal being connected to the second gate line, the first source terminal being connected to the data line, the first drain terminal being connected through a via to the pixel electrode.

4. The structure of the pixel as claimed in claim 1, wherein the common electrode line provides a reference voltage to the pixel unit and the first gate line supplies a control signal to have the second thin-film transistor of the pixel unit early switched on by one period of line scanning time so as to early set a voltage of the pixel electrode to the reference voltage by one period of line scanning time.

5. The structure of the pixel as claimed in claim 4, wherein the second thin-film transistor comprises a second gate terminal, a second source terminal, and a second drain terminal, the second gate terminal being connected to the first gate line, the second source terminal being connected to the common electrode line, the second drain terminal being connected to the pixel electrode.

6. The structure of the pixel as claimed in claim 5, wherein the second source terminal is connected through a via to the common electrode line and the second drain terminal is connected through a via to the pixel electrode.

7. The structure of the pixel as claimed in claim 1, wherein the pixel electrode comprises a transparent conductive layer and the pixel electrode is formed by depositing indium tin oxide.

8. The structure of the pixel as claimed in claim 1, wherein the structure of the pixel is applicable to a liquid crystal display panel that is a twisted nematic (TN) type liquid crystal display panel or a patterned vertical alignment (PVA) type liquid crystal display panel.

\* \* \* \* \*